(12) United States Patent
Fujisawa et al.

(10) Patent No.: US 7,881,036 B2
(45) Date of Patent: Feb. 1, 2011

(54) ELECTRODE SHEET FOR ELECTROSTATIC CHUCK, AND ELECTROSTATIC CHUCK

(75) Inventors: Hiroshi Fujisawa, Nara (JP); Kinya Miyashita, Kanagawa (JP)

(73) Assignee: Creative Technology Corporation, Tokyo (JP)

( * ) Notice: Subject to any disclaimer, the term of this patent is extended or adjusted under 35 U.S.C. 154(b) by 434 days.

(21) Appl. No.: 12/085,349

(22) PCT Filed: Nov. 30, 2006

(86) PCT No.: PCT/JP2006/323970
§ 371 (c)(1),
(2), (4) Date: May 22, 2008

(87) PCT Pub. No.: WO2007/066572
PCT Pub. Date: Jun. 14, 2007

(65) Prior Publication Data
US 2009/0040681 A1    Feb. 12, 2009

(30) Foreign Application Priority Data
Dec. 6, 2005  (JP) .............................. 2005-351441

(51) Int. Cl.
*H01L 21/683* (2006.01)
*B23B 31/28* (2006.01)

(52) U.S. Cl. ....................... 361/234; 361/233; 361/230; 279/128

(58) Field of Classification Search ................. 361/234, 361/230, 233; 279/128
See application file for complete search history.

(56) References Cited

U.S. PATENT DOCUMENTS 5,522,131 A * 6/1996 Steger .......................... 29/829
5,535,507 A * 7/1996 Barnes et al. ................ 29/825
5,745,331 A * 4/1998 Shamouilian et al. ....... 361/234
6,117,246 A    9/2000 Parkhe et al.
2007/0223173 A1  9/2007 Fujisawa et al.

FOREIGN PATENT DOCUMENTS

JP          07-007074 A       1/1995

(Continued)

OTHER PUBLICATIONS

PCT/JP2006/323970—English translation of International Preliminary Report on Patentability and Written Opinion of the International Searching Authority (Forms PCT/IB/373; PCT/IB/338 and PCT/ISA/237) mailed June 19, 2008.

*Primary Examiner*—Stephen W Jackson
*Assistant Examiner*—Zeev Kitov
(74) *Attorney, Agent, or Firm*—Birch, Stewart, Kolasch & Birch, LLP

(57) ABSTRACT

An electrostatic chuck electrode sheet which allows the difference in capacitance between electrodes due to the presence or absence of a substrate to be increased to a level which can be accurately detected using a known substrate detection device, and allows an electrostatic chuck to exhibit an excellent attraction force, and an electrostatic chuck using the electrode sheet, are disclosed. The electrode sheet has a layered structure in which a first insulating layer, a first electrode layer, an inter-electrode insulating layer, a second electrode layer, and a second insulating layer are stacked and attracts a substrate on the first insulating layer, the first electrode layer having a plurality of openings in a specific planar area, and the second electrode layer having opening equivalent portions provided at positions at which the openings in the first electrode layer are projected onto the second electrode layer in a depth direction of the electrode sheet and having almost the same area as the projected openings, and connection portions that connect the opening equivalent portions. The electrostatic chuck is formed using the electrode sheet.

7 Claims, 6 Drawing Sheets

FOREIGN PATENT DOCUMENTS

| | | |
|---|---|---|
| JP | 2000-164684 A | 6/2000 |
| JP | 2000-228440 A | 8/2000 |
| JP | 2005-064105 A | 3/2005 |
| WO | WO-2005/091356 A1 | 9/2005 |

* cited by examiner

ELECTRODE SHEET FOR ELECTROSTATIC CHUCK, AND ELECTROSTATIC CHUCK

TECHNICAL FIELD

The present invention relates to an electrostatic chuck electrode sheet and an electrostatic chuck using the electrode sheet.

BACKGROUND ART

An electrostatic chuck which attracts and holds a semiconductor substrate (e.g., silicon wafer) is used for various devices (e.g., ion implantation device, ion doping device, and plasma immersion device) utilized in a semiconductor production process. In the field of liquid crystal production, an electrostatic chuck which attracts and holds a glass substrate (i.e., insulating substrate) is used for a substrate bonding device utilized when sealing a liquid crystal between the insulating substrates, an ion doping device, and the like.

A device using an electrostatic chuck must reliably determine whether or not the electrostatic chuck holds a substrate in order to enable a continuous or automated production process. For example, ion implantation or the like cannot be performed if the substrate is not attracted to the electrostatic chuck. On the other hand, if the substrate cannot be removed from the electrostatic chuck, the substrate cannot be transferred to the subsequent step. It is important to check the presence or absence of the substrate for the production process using such a device in order to achieve mass production.

When using a bipolar electrostatic chuck which attracts a substrate due to the potential difference between two electrodes, a substrate detection device is generally used which detects whether or not the substrate is attracted to the electrostatic chuck by measuring the capacitance between the electrodes. For example, JP-A-7-7074 (Patent Document 1) discloses a method which detects a case where a substrate is absent, a case where a substrate is present but is not attracted, and a case where a substrate is attracted using a capacitance detection circuit connected between the electrodes of the electrostatic chuck. JP-A-2000-228440 (Patent Document 2) discloses a method in which a capacitance measurement device is provided between the electrodes of the electrostatic chuck, and the electrostatic chuck is moved vertically to accurately detect whether or not the electrostatic chuck sufficiently attracts and holds a substrate. A line of electric force produced from the electrodes of the electrostatic chuck generally reaches a substrate held by the electrostatic chuck. Therefore, when a substrate having a high dielectric constant (e.g., the relative dielectric constant of a silicon wafer is about 5.4) as compared with a vacuum is present, the capacitance between the electrodes increases. FIG. 5 schematically shows such a state. Since a line of electric force (partially indicated by a broken line in FIG. 5) produced between electrodes 10 and 11 reaches a substrate W, the capacitance between the electrodes differs depending on the presence or absence of the substrate W.

In recent years, along with an increase in demand for flat panel displays, the panel size of flat panel displays has been increased. For example, some liquid crystal mother glass substrates have dimensions larger than 2×2 m. In order to process such a large substrate, it is necessary to further increase the attraction force (holding force) of an electrostatic chuck. The inventors of the present invention have proposed an electrostatic chuck using an electrode sheet obtained by stacking two electrode layers in the depth direction of the electrode sheet through an inter-electrode insulating layer instead of disposing two electrodes side by side in a plane, differing from a known bipolar electrostatic chuck (see Patent Document 3). An electrostatic chuck which has a high dielectric strength and exhibits an attraction force sufficient for a large substrate can be obtained by stacking two electrode layers in the depth direction of the electrode sheet through an inter-electrode insulating layer.

When two electrode layers are stacked in the depth direction of the electrode sheet, the capacitance between the electrodes is mainly determined by the area over which the electrode layers disposed through the inter-electrode insulating layer are opposite to each other. FIG. 6 schematically shows such a state. Specifically, lines of electric force which occur between the electrodes are classified into a line of electric force which reaches the substrate W (indicated by a broken line I) and a line of electric force which occurs only between the electrodes (indicated by a broken line II). The line of electric force (II) mainly occurs. Therefore, when two electrode layers are stacked in the depth direction of the electrode sheet, the capacitance between the electrodes does not differ to a large extent depending on the presence or absence of the substrate. As a result, the presence or absence of the substrate may not be accurately detected using a substrate detection device utilizing the above-mentioned substrate detection method.

Patent Document 1: JP-A-7-7074
Patent Document 2: JP-A-2000-228440
Patent Document 3: WO 2005/091356

DISCLOSURE OF THE INVENTION

Problems to be Solved by the Invention

The inventors conducted extensive studies in order to reduce erroneous detection when using a known substrate detection device in the case where two electrode layers are stacked in the depth direction through an inter-electrode insulating layer so that the electrostatic chuck exhibits a high attraction force. As a result, the inventors found that the above-mentioned erroneous detection problem can be solved by reducing the capacitance between the electrodes when a substrate is absent. This finding has led to the completion of the present invention.

Accordingly, an object of the present invention is to provide an electrostatic chuck electrode sheet which allows the difference in capacitance between the electrodes due to the presence or absence of a substrate to be increased to a level which can be accurately detected using a known substrate detection device, and allows an electrostatic chuck to exhibit an excellent attraction force.

Another object of the present invention is to provide an electrostatic chuck using the above electrode sheet.

Means for Solving the Problems

Specifically, the present invention provides an electrode sheet having a layered structure in which a first insulating layer, a first electrode layer, an inter-electrode insulating layer, a second electrode layer, and a second insulating layer are stacked and attracting a substrate on the first insulating layer, the first electrode layer having a plurality of openings in a specific planar area, and the second electrode layer having opening equivalent portions provided at positions at which the openings in the first electrode layer are projected onto the second electrode layer in a depth direction of the electrode sheet and having almost the same area as the projected openings, and connection portions that connect the opening equivalent portions.

The present invention also provides an electrostatic chuck comprising a metal base and the above electrode sheet that is bonded to the metal base.

In the present invention, the first electrode layer must have a plurality of openings in a specific planar area. A line of electric force (line of electric force I in FIG. 6) which occurs between the first electrode layer and the second electrode layer and passes through the substrate passes through the opening in the first electrode layer. The shape of the opening is not particularly limited. For example, the opening may be circular, oval, polygonal (e.g., triangular), regular polygonal, or the like. The opening is preferably circular or oval in order to prevent the opening from serving as a discharge starting point, for example. Note that the first electrode layer may have openings which differ in shape. It is preferable that the first electrode layer have openings having an identical shape so that the electrode sheet exhibits a uniform attraction force over the entire surface of the substrate, for example.

When a shortest distance between adjacent openings in the first electrode layer is referred to as X, and the length of a line segment defined by the feet of perpendiculars when projecting the centers of gravity of the adjacent openings onto an imaginary straight line parallel to a straight line along which the adjacent openings are provided at the shortest distance X is referred to as L, the first electrode layer preferably satisfies $L/X \geq 1.5$ and $L \leq 2.5$ mm. The ratio $L/X$ is an index that indicates the ratio of the opening to the shortest distance X between two adjacent openings. The opening increases as the ratio $L/X$ increases. The distribution of the potential from the second electrode layer can be increased by increasing the ratio of the opening. Specifically, the number of lines of electric force (line of electric force I in FIG. 6) which occur between the first electrode layer and the second electrode layer and pass through the substrate increases, whereby the gradient force (attraction force) with respect to the substrate can be increased. It is considered that the gradient force generation effect is saturated when the ratio $L/X$ exceeds five. If the length L exceeds 2.5 mm, the total amount of gradient force which acts on the substrate decreases, whereby it is difficult to obtain a sufficient attraction force and a sufficient holding force. The shortest distance X is preferably 0.2 mm or more since the gradient force can be efficiently produced so that a high attraction force (holding force) can be obtained. The shortest distance X between the adjacent openings corresponds to the minimum width of the conductive portion of the first electrode layer positioned between the adjacent openings.

It is preferable that the openings be regularly disposed in a specific planar area. For example, it is preferable that the openings be regularly disposed so that the centers of gravity of the adjacent openings are positioned on a straight line along the shortest distance X between the openings. The attraction force with respect to the substrate can be more uniformly produced by regularly disposing the openings in the first electrode layer.

The second electrode layer has the opening equivalent portions and the connection portions. In the electrode sheet having a layered structure in which the first insulating layer, the first electrode layer, the inter-electrode insulating layer, the second electrode layer, and the second insulating layer are stacked, the opening equivalent portions are provided at positions at which the openings in the first electrode layer are projected onto the second electrode layer in the depth direction of the electrode sheet, and have almost the same area as the projected openings. The connection portions connect the opening equivalent portions. The opening equivalent portion having almost the same area as the projected opening in the first insulating layer allows the potential of the second electrode layer to reach the substrate therethrough. The opening equivalent portion is required to obtain an attraction force with respect to the substrate. If the opening equivalent portion is too large, the number of lines of electric force (line of electric force II in FIG. 6) which occur only between the first electrode layer and the second electrode layer increases, whereby it becomes difficult to detect the substrate using a known substrate detection method based on the capacitance between the electrodes.

Specifically, if the area of the opening equivalent portion is equal to or smaller than the area of the projected opening, the number of lines of electric force (line of electric force II in FIG. 6; in this case, a line of electric force other than a line of electric force which occurs between the electrodes in the vertical direction is disregarded) which occur only between the opening equivalent portions and the first electrode layer other than the openings is minimized. If the area of the opening equivalent portion is larger than the area of the projected opening, the number of lines of electric force (line of electric force II in FIG. 6) which occur only between the electrodes increases, whereby the capacitance between the electrodes increases. If the capacitance between the electrodes in the absence of the substrate increases, erroneous detection is likely to occur when using a known substrate detection device which detects the presence or absence of the substrate based on the difference in capacitance that increases when the substrate is present. Therefore, the opening equivalent portions are provided at positions at which the openings in the first electrode layer are projected onto the second electrode layer in the depth direction of the electrode sheet, and have almost the same area as the projected openings. The expression "the opening equivalent portions have almost the same area as the projected openings" includes the case where the area of the opening equivalent portion is larger or smaller than the area of the projected opening to a small extent. For example, the area of the opening equivalent portion may differ from the area of the projected opening in an amount of ±20% or less. It is preferable that the opening equivalent portions have the same area as the projected openings. It is more preferable that the opening equivalent portions have an identical shape to the projected openings.

The shape, the arrangement, the number, and the like of the connection portions that connect the opening equivalent portions may be appropriately determined insofar as the opening equivalent portions of the second electrode layer can be kept at the same potential and an isolated opening equivalent portion is not present. It is preferable that the connection portions be as thin as possible in order to form a line of electric force (line of electric force II in FIG. 6) which occurs only between the opening equivalent portions and the first electrode layer other than the openings.

When forming an electrode sheet using the first electrode layer and the second electrode layer as described above, and optionally forming an electrostatic chuck by bonding the electrode sheet to a metal base, it is preferable that a capacitance C1 between the first electrode layer and the second electrode layer when the electrode sheet attracts the substrate and a capacitance C2 between the first electrode layer and the second electrode layer when the electrode sheet does not attract the substrate satisfy $(C1-C2)/C1 \geq 0.03$, and more preferably $(C1-C2)/C1 \geq 0.05$. If $(C1-C2)/C1 \geq 0.03$, the presence or absence of the substrate can be accurately detected using a known substrate detection device.

Examples of materials for the first electrode layer and the second electrode layer include copper, tungsten, aluminum, nickel, chromium, silver, platinum, tin, molybdenum, magnesium, palladium, tantalum, and the like. It is preferable to use copper or aluminum from the viewpoint of conductivity or productivity. The first electrode layer and the second electrode layer may be formed of the same material or different materials. The thicknesses of the first electrode layer and the second electrode layer may be appropriately selected. The thicknesses of the first electrode layer and the second electrode layer are preferably 0.1 to 20 μm. It is more preferable that the first electrode layer have a thickness of 0.1 to 5 μm. Elevations or depressions of the first electrode layer may affect the surface of the first insulating layer to which the substrate is attracted. If the thickness of the first electrode layer is 0.1 to 5 μm, the flatness of the first electrode layer can be ensured without requiring a special treatment (e.g., lapping treatment) so that the surface roughness Ra of the first insulating layer can be adjusted to about 1 μm.

The first electrode layer and the second electrode layer may be formed by etching a metal foil formed of the above-mentioned metal into a specific shape, for example. The first electrode layer and the second electrode layer may be formed by etching metal layers of a laminate in which a metal layer is provided on each side of an insulating film (e.g., polyimide film). The above-mentioned metal may be deposited on the second insulating layer, the first insulating layer, the inter-electrode insulating layer, or the insulating layer by sputtering, ion plating (ion plating deposition), vapor deposition, plating, or the like, and the deposited metal layer may be optionally etched into a specific shape. The electrode layer may be formed by printing a metal paste on the surface of the above insulating layer. An electrode layer having a specific shape may be formed by spraying a high-melting-point metal (e.g., molybdenum, tungsten, or tantalum) on the surface of the above insulating layer. It is suitable to use ion plating when forming a first electrode layer having a thickness of 0.1 to 5 μm.

The first insulating layer, the inter-electrode insulating layer, and the second insulating layer may be a resin layer formed of one or more resins selected from a polyimide, polyamideimide, polyester, polyethylene terephthalate, an epoxy resin, an acrylic resin. The first insulating layer, the inter-electrode insulating layer, and the second insulating layer may be a ceramic layer formed of one or more ceramics selected from aluminum oxide, aluminum nitride, silicon carbide, silicon nitride, zirconia, and titania. The first insulating layer, the inter-electrode insulating layer, and the second insulating layer may be a layer formed of one or two materials selected from silicon and silicon dioxide. It is preferable that the first insulating layer, the inter-electrode insulating layer, and the second insulating layer be a resin layer formed of one or more resins selected from a polyimide, polyamideimide, polyester, polyethylene terephthalate, and an epoxy resin from the viewpoint of mass productivity. It is preferable that the first insulating layer, the inter-electrode insulating layer, and the second insulating layer be formed of a polyimide from the viewpoint of insulating properties and chemical resistance. The first insulating layer, the inter-electrode insulating layer, and the second insulating layer may be formed of the same material or appropriately selected different materials.

The thicknesses of the first insulating layer, the inter-electrode insulating layer, and the second insulating layer may be appropriately selected. The thickness of the first insulating layer is preferably 50 to 300 μm. The thickness of the inter-electrode insulating layer is preferably 25 to 100 μm. The thickness of the second insulating layer is preferably 25 to 100 μm.

An electrostatic chuck can be formed by bonding the electrode sheet according to the present invention to a metal base generally used for an electrostatic chuck. The metal base may be an aluminum base formed of aluminum or an aluminum alloy, for example. The electrode sheet may be bonded to the metal base using the second insulating layer which exhibits self-adhesion. The electrode sheet may be bonded to the metal base through an adhesive film provided on the second insulating layer. A flexible silicone rubber layer having a thickness of 500 to 1000 μm may be provided between the second insulating layer and the metal base. When an electrostatic chuck attracts a substrate such as a silicon wafer, the contact ratio (degree of adhesion) between the electrode sheet and the substrate is about several to ten percent when using the first insulating layer formed of a rubber elastic body as the substrate attraction surface. In this case, the contact ratio decreases to about one percent when the first insulating layer is formed of a polyimide. Therefore, the contact ratio between the electrode sheet and the substrate can be increased by providing a flexible layer between the metal base and the second insulating layer, whereby a high attraction force can be obtained while improving substrate cooling efficiency to a large extent.

A method of producing the electrostatic chuck is not particularly limited. For example, the second insulating layer, the second electrode layer, the inter-electrode insulating layer, the first electrode layer, and the first insulating layer are stacked on the metal base in this order from the metal base. A polyimide adhesive film is placed between the layers, and a flexible layer is placed between the metal base and the second insulating layer, if necessary. The layers are then thermocompression-bonded under specific heating and pressurization conditions to obtain an electrostatic chuck having a layered structure. Alternatively, after forming an electrode sheet in advance, a flexible layer may be placed between the electrode sheet and the metal base, if necessary. The layers may then be thermocompression-bonded under specific heating and pressurization conditions. The process of forming the layered structure is not particularly limited insofar as the first insulating layer, the first electrode layer, the inter-electrode insulating layer, the second electrode layer, and the second insulating layer are provided in that order.

Effect of the Invention

According to the present invention, when stacking two electrode layers in the depth direction through the inter-electrode insulating layer so that the electrostatic chuck exhibits a high attraction force, an excellent gradient force that provides the attraction force (holding force) of the electrostatic chuck can be obtained by optimizing the shape of the first electrode layer and the second electrode layer. Moreover, erroneous detection when using a known substrate detection device can be suppressed by reducing the capacitance between the first electrode layer and the second electrode layer in the absence of a substrate as far as possible.

EXPLANATION OF SYMBOLS

X: bipolar electrostatic chuck, W: substrate, 1: electrode sheet, 2: first insulating layer, 3: first electrode layer, 3a:

opening, 4: inter-electrode insulating layer, 5: second electrode layer, 5a: opening equivalent portion, 5b: connection portion, 6: second insulating layer, 7: flexible layer, 8: metal base, 9: direct-current power supply, 10 and 11: electrode

BEST MODE FOR CARRYING OUT THE INVENTION

Preferred embodiments of the present invention are described in detail below.

Figure 1:
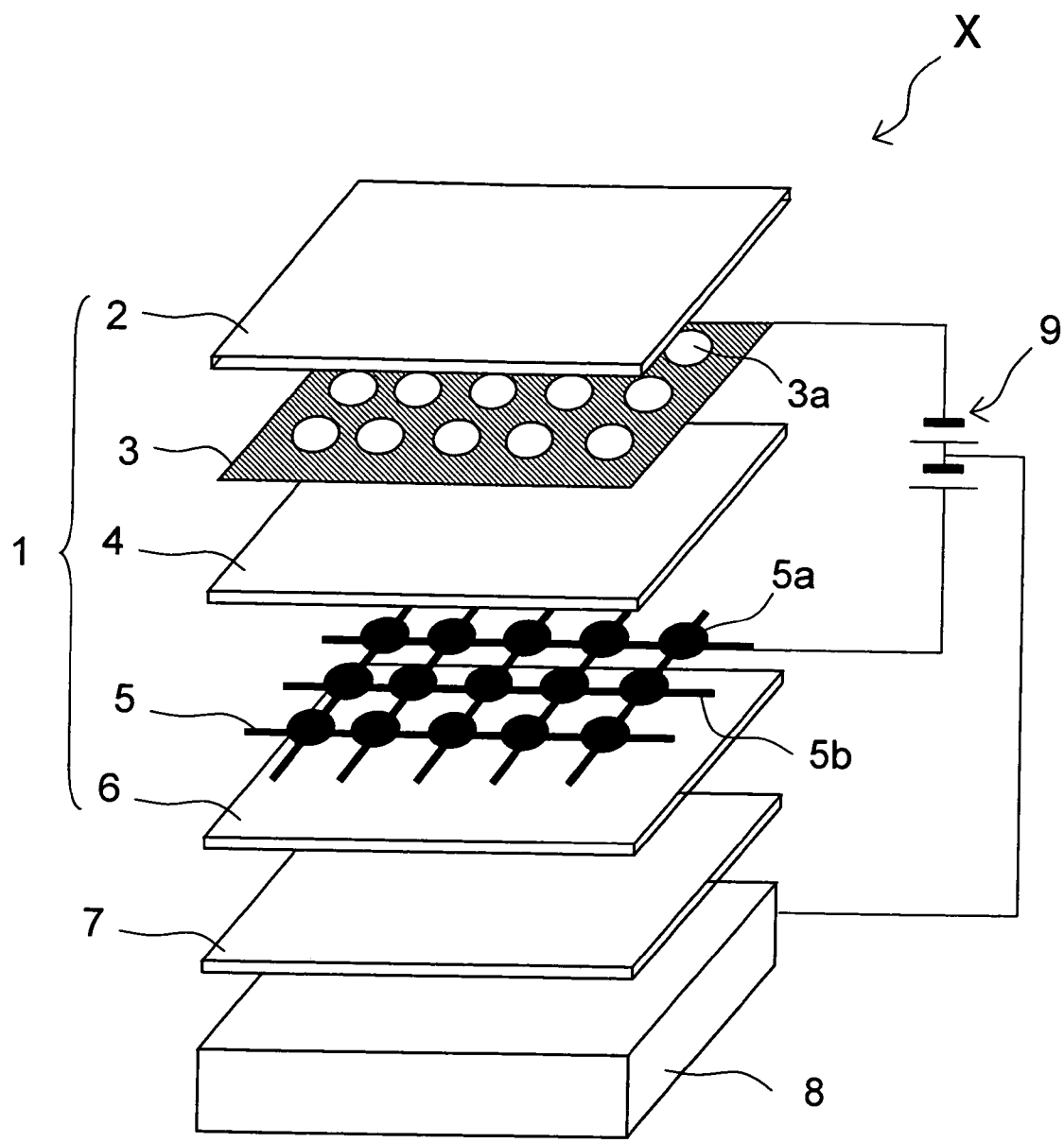
FIG. 1 is an exploded oblique view illustrative of a bipolar electrostatic chuck X formed using an electrode sheet 1 according to the present invention.

FIG. 1 is an exploded oblique view illustrative of a bipolar electrostatic chuck X formed using an electrostatic chuck electrode sheet 1 according to the present invention. The electrode sheet 1 has a layered structure in which a first insulating layer 2, a first electrode layer 3, an inter-electrode insulating layer 4, a second electrode layer 5, and a second insulating layer 6 are stacked. The surface of the first insulating layer 2 forms a substrate attraction surface that attracts a substrate (not shown). The electrode sheet 1 is bonded to a metal base 8 through a flexible layer 7 to form an electrostatic chuck X. A direct-current power supply 9 is connected to the first electrode layer 3 and the second electrode layer 5 so that a potential difference occurs between the first electrode layer 3 and the second electrode layer 5. The electrostatic chuck X may attract a common substrate such as a silicon wafer or a glass substrate. Since such a substrate has a relatively high dielectric constant as compared with a vacuum, the substrate can be detected by the capacitance change rate depending on the presence or absence of the substrate.

Figure 2:
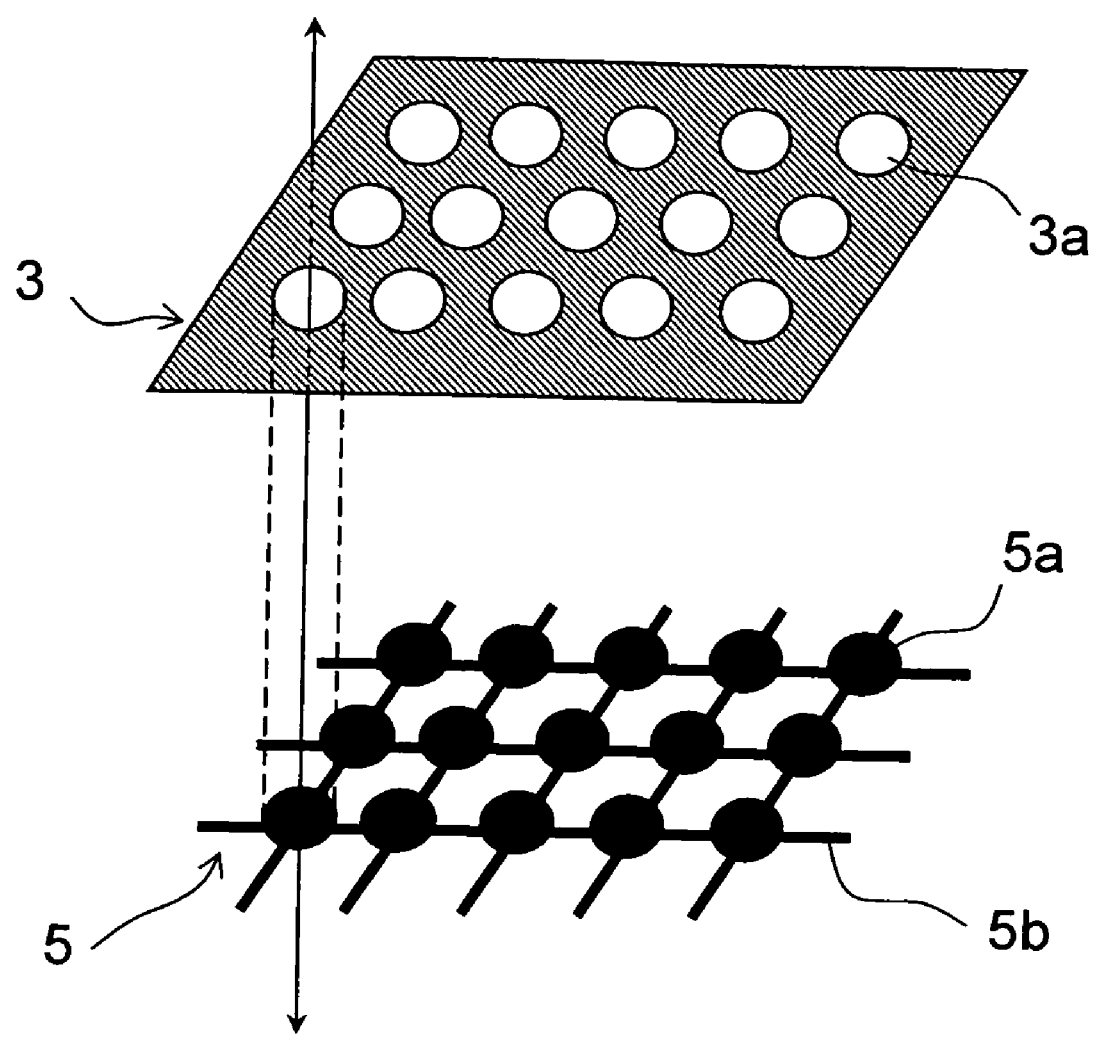
FIG. 2 is an oblique view illustrative of the relationship between a first electrode layer and a second electrode layer according to the present invention.

The first electrode layer 3 of the electrode sheet 1 has a plurality of circular openings (circular holes) 3a in a specific planar area. In FIG. 1, a patterned electrode is formed in which the openings 3a are disposed in a grid pattern so that the openings 3a are positioned at the vertices of a square. The second electrode layer 5 of the electrode sheet 1 has opening equivalent portions 5a provided at positions at which the openings 3a in the first electrode layer 3 are projected onto the second electrode layer 5 in the depth direction of the electrode sheet 1 and having an identical shape to the projected openings 3a. The number of opening equivalent portions 5a is preferably the same as the number of openings 3a in the first electrode layer 3. The second electrode layer 5 has a connection portion 5b that connects the adjacent opening equivalent portions 5a. A grid-shaped patterned electrode is formed by the opening equivalent portions 5a and the connection portions 5b. FIG. 2 shows the opening equivalent portions 5a which are provided at positions at which the openings 3a in the first electrode layer 3 are projected onto the second electrode layer 5 in the depth direction of the electrode sheet 1 and have an identical shape to that of the projected openings 3a.

Figure 3:
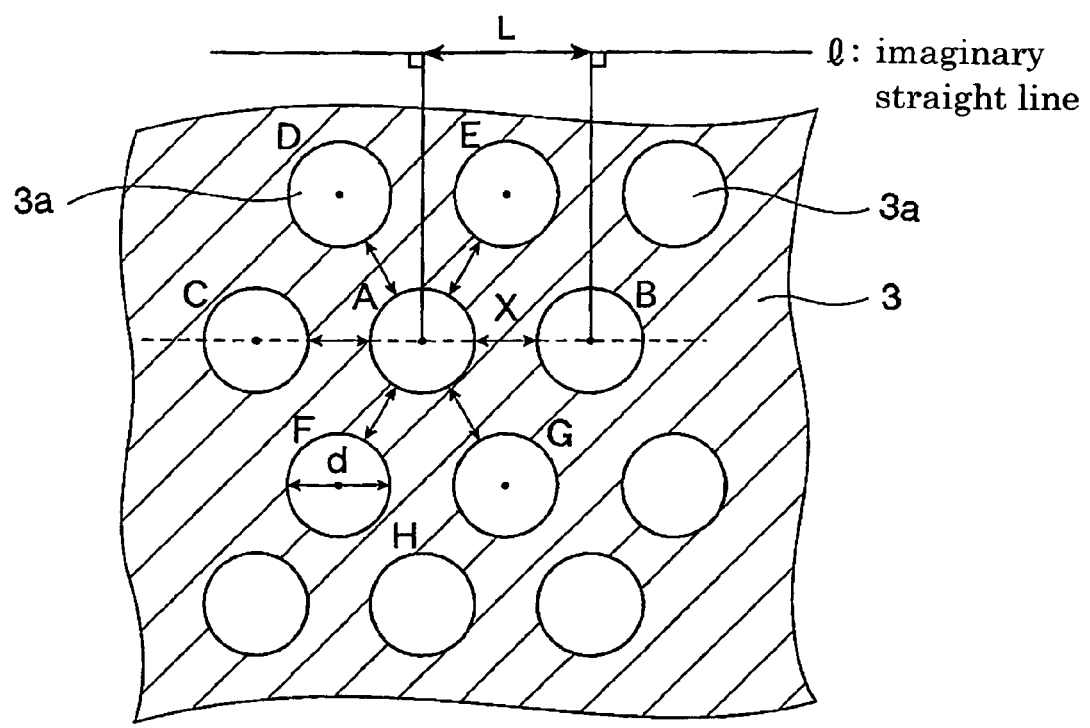
FIG. 3 is a plan view (partially enlarged view) illustrative of a modification of a first electrode layer.

FIG. 3 shows a modification in which the arrangement of the openings 3a differs from that of the first electrode layer 3 shown in FIG. 1. The first electrode layer 3 shown in FIG. 3 has a plurality of openings 3a which are circular holes. A circular hole A is adjacent to circular holes B, C, D, E, F, and G at a shortest distance X. In this case, the circular holes B, C, D, E, F, and G are disposed corresponding to the positions of the vertices of a regular hexagon. Note that a circular hole H is not adjacent to the circular hole A at the shortest distance X. For example, the circular holes A, F, C, and D in the first electrode layer 3 form a quadrangle, and may be considered to form a grid-shaped patterned electrode.

In FIG. 3, when a straight line 1 parallel to a straight line along which the circular holes A and B are adjacent at the shortest distance X is referred to as an imaginary straight line, for example, the length L of a line segment defined by the feet of perpendiculars is obtained by projecting the centers of gravity (centers) of the circular holes A and B onto the imaginary straight line 1. The diameter of each circular hole in the first electrode layer 3 shown in FIG. 3 is 1.2 mm, for example.

When the shortest distance X between the adjacent circular holes is 1.0 mm, the length L of the line segment is 2.2 mm (i.e., L=0.6+1.0+0.6=2.2 mm), and the ratio L/X is 2.2. When a hole or an opening having a size which does not allow the hole or opening to substantially function as the opening according to the present invention is formed in the first electrode layer 3, the shortest distance X and the length of the line segment L are calculated based on holes or openings which substantially function as the openings according to the present invention.

Figure 4:
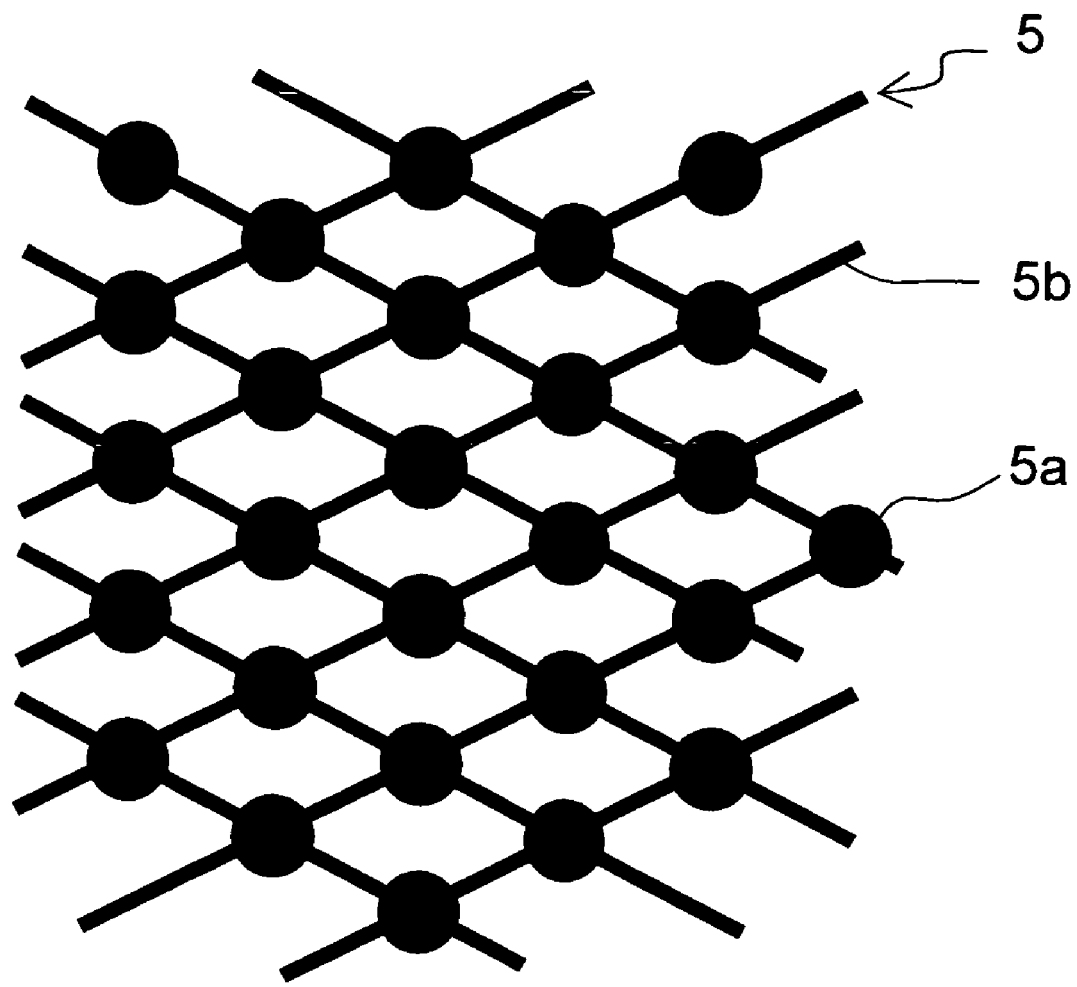
FIG. 4 is a plan view (partially enlarged view) illustrative of a modification of a second electrode layer corresponding to the first electrode layer shown in FIG. 3.
Figure 4:
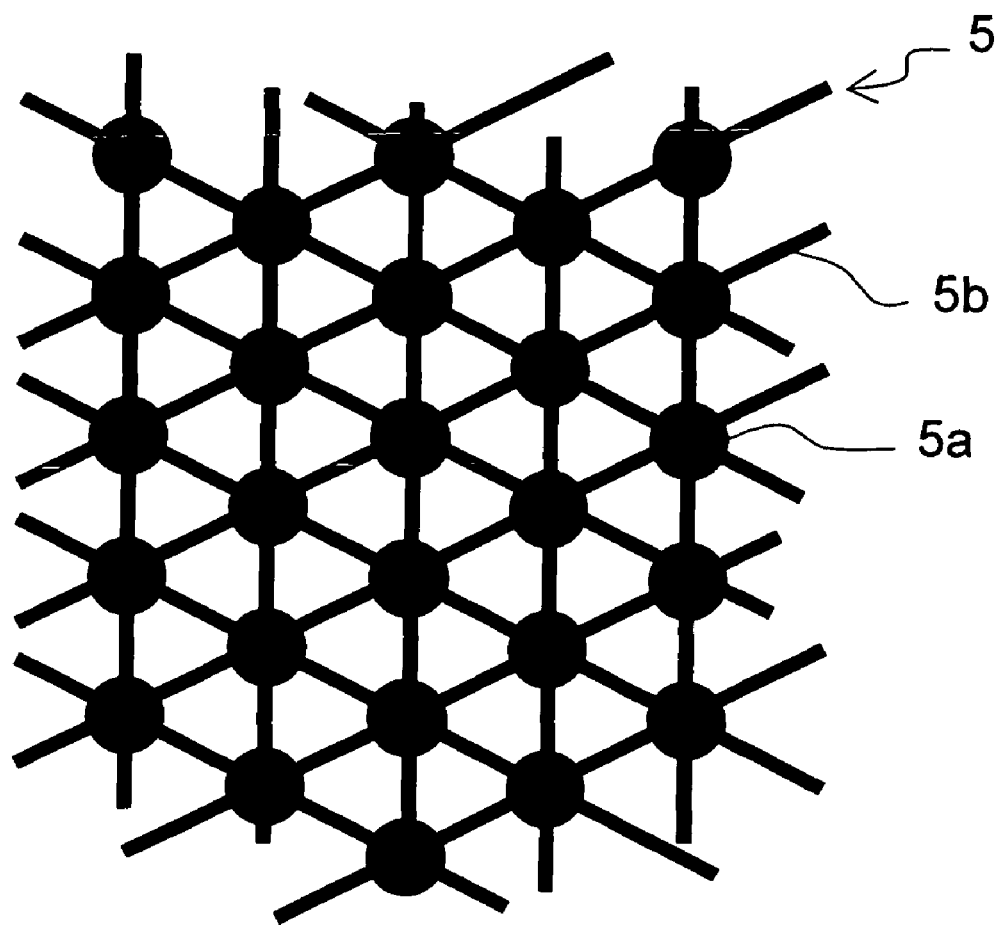
Figure 5:
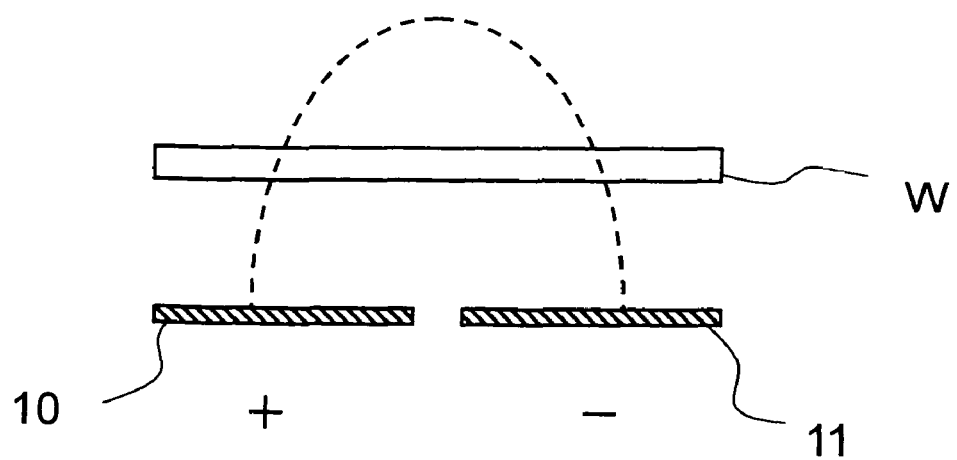
FIG. 5 is a cross-sectional view (schematic view) showing a line of electric force which occurs between electrodes of a known bipolar electrostatic chuck.
Figure 6:
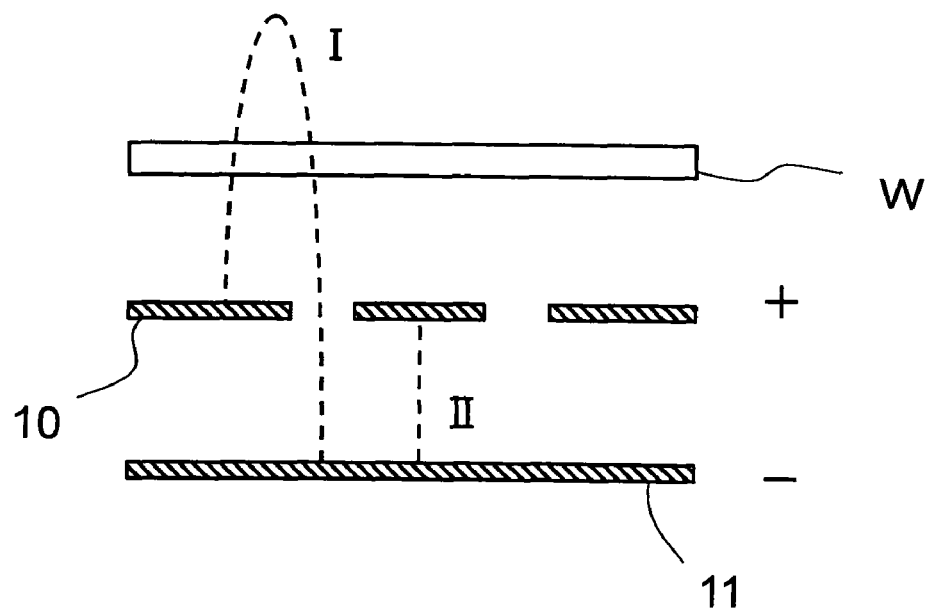
FIG. 6 is a cross-sectional view (schematic view) showing a line of electric force which occurs between electrodes of a known bipolar electrostatic chuck in which the electrodes are stacked in the depth direction.

FIG. 3 shows a second electrode layer 5 corresponding to the first electrode layer 3 shown in FIG. 3. The second electrode layer 5 shown in FIG. 4 has circular opening equivalent portions 5a provided at positions at which the openings (circular holes) 3a in the first electrode layer 3 shown in FIG. 3 are projected onto the second electrode layer 5 in the depth direction of the electrode sheet 1. The diameter of the opening equivalent portion 5a is the same as the diameter (i.e., 1.2 mm) of the circular hole in the first electrode layer 3. When focusing on one opening equivalent portion 5a, the opening equivalent portions 5a adjacent to that opening equivalent portion 5a are disposed at the positions of the vertices of a regular hexagon at a shortest distance X of 1.0 mm. The opening equivalent portions 5a are connected through the connection portion 5b. For example, four connection portions 5b may be connected to one opening equivalent portion 5a to form a grid-shaped second electrode layer 5, as shown in FIG. 4(a), or one opening equivalent portion 5a may be connected to all of the adjacent opening equivalent portions 5a through the connection portions 5b, as shown in FIG. 4(b). Breakage of the second electrode layer 5 can be suppressed as far as possible by increasing the number of the connection portions 5b. However, the configuration shown in FIG. 4(a) is preferable from the viewpoint of reducing the capacitance between the first electrode layer 3 and the second electrode layer 5. The thickness of the connection portion 5b is preferably 0.1 to 0.5 mm. It is relatively difficult to obtain a connection portion having a thickness of less than 0.1 mm by etching. On the other hand, if the thickness of the connection portion 5b is larger than 0.5 mm, the capacitance between the first electrode layer 3 and the second electrode layer 5 increases.

EXAMPLE 1

An electrode sheet 1 was formed as described below using the first electrode layer 3 shown in FIG. 3 and the corresponding second electrode layer 5 shown in FIG. 4(b). A bipolar electrostatic chuck X was obtained using the electrode sheet 1. A polyimide sheet ("Kapton" manufactured by Du Pont-Toray Co., Ltd.) having a length of 206 mm, a width of 206 mm, and a thickness of 50 μm was provided. Each side of the polyimide sheet was subjected to an ion plating treatment (smoothing treatment) to form a chromium layer having a thickness of 0.1 μm. A copper electrode layer having a thickness of 0.4 μm was formed on each side of the polyimide sheet (inter-electrode insulating layer 4) by ion plating. The first electrode layer 3 shown in FIG. 3 was formed by etching one of the electrode layers, and the second electrode layer 5 shown in FIG. 4(b) was formed by etching the other electrode layer. The first electrode layer 3 was formed so that a plurality of circular holes 3a having a diameter of 1.2 mm were disposed in a 200×200 mm area. The circular holes 3a were formed so that a single circular hole 3a was adjacent to the circular holes 3a positioned at the vertices of a regular hexagon formed around that circular hole 3a at a shortest distance X of 1.0 mm. The second electrode layer 5 was formed so that a plurality of opening equivalent portions 5a having a diameter of 1.2 mm were provided in a 200×200 mm area corresponding to the circular holes 3a in the first electrode layer 3, and the adjacent opening equivalent portions 5a were connected through the connection portions 5b having a width of 0.2 mm.

A polyimide film ("Kapton" manufactured by Du Pont-Toray Co., Ltd.) (first insulating layer 2) having a length of 206 mm, a width of 206 mm, and a thickness of 125 μm was bonded to the surface of the first formed electrode layer 3 through a thermoplastic polyimide adhesive sheet having a thickness of 20 μm. A polyimide film ("Kapton" manufactured by Du Pont-Toray Co., Ltd.) (second insulating layer 6) having a length of 206 mm, a width of 206 mm, and a thickness of 40 μm was bonded to the surface of the second electrode layer 5 through the above-mentioned adhesive sheet. A cushion material was respectively placed on the surface of the first insulating layer 2 and the surface of the second insulating layer 6. The layered product was placed in a hot press machine, and was hot-pressed at a pressure in the thickness direction of 2 MPa, a heating temperature of 150° C., and a retention time of five minutes. The cushion materials were then removed to obtain an electrode sheet 9 having a layered structure in which the first insulating layer 2, the first electrode layer 3, the inter-electrode insulating layer 4, the second electrode layer 5, and the second insulating layer 6 were stacked. The first insulating layer 2, the inter-electrode insulating layer 4, and the second insulating layer 6 had a relative dielectric constant of 3.5.

The electrode sheet 1 thus obtained was placed on the surface of a flat porous ceramic so that the first insulating layer 2 was opposite to the porous ceramic. An aluminum base 8 was placed on the second insulating layer 6 through a silicone rubber spacer having a height of 0.7 mm and a diameter of 5 mm. The aluminum base 8 was made of an aluminum alloy (A5056), and included a water-cooled pipe having a diameter of 184 mm. A self-adhesive liquid silicone rubber ("TSE3663" manufactured by GE Toshiba Silicones Co., Ltd.) was injected into an opening between the aluminum base 8 and the electrode sheet 1 formed by the spacer, and was defoamed under vacuum. The electrode sheet 1 was placed under vacuum through the porous ceramic so that the electrode sheet 1 adhered to the surface of the porous ceramic. The silicone rubber was then cured about overnight. The electrode sheet 1 and the aluminum base 8 were thus bonded through the flexible silicone rubber layer 7 having a thickness of 0.7 mm to obtain a bipolar electrostatic chuck X. The surface (substrate attraction surface) of the first insulating layer 2 had elevations or depressions of ±1 μm or less.

A capacitance C1 between the first electrode layer 3 and the second electrode layer 5 of the bipolar electrostatic chuck X when causing the bipolar electrostatic chuck X to attract a silicon wafer (relative dielectric constant: 5.4) having a diameter of 200 mm and a thickness of 0.8 mm, and a capacitance C2 between the first electrode layer 3 and the second electrode layer 5 in the absence of the silicon wafer were calculated by two-dimensional finite element analysis. The results are shown in Table 1. As shown in Table 1, the capacitance change rate ((C1−C2)/C1) due to the presence or absence of the silicon wafer was 0.087, which can be sufficiently and accurately detected using a known substrate detection device.

TABLE 1

|  | C1 (with wafer) (pF) | C2 (without wafer) (pF) | (C1 − C2)/C1 |
|---|---|---|---|
| Example 1 | 2750 | 2510 | 0.087 |
| Comparative Example 1 | 10930 | 10670 | 0.024 |

COMPARATIVE EXAMPLE 1

A bipolar electrostatic chuck X was produced in the same manner as in Example 1, except that a planar electrode (length: 200 mm, width: 200 mm, thickness: 0.4 μm) of which the entire planar area served as an electrode was used as the second electrode layer 5. A capacitance C1 between the first electrode layer 3 and the second electrode layer 5 of the electrostatic chuck X of Comparative Example 1 when causing the electrostatic chuck X to attract a silicon wafer (relative dielectric constant: 5.4), and a capacitance C2 between the first electrode layer 3 and the second electrode layer 5 in the absence of the silicon wafer were calculated in the same manner as in Example 1. The results are shown in Table 1. As shown in Table 1, the capacitance change rate ((C1−C2)/C1) due to the presence or absence of the silicon wafer was 0.024. Therefore, erroneous detection may occur when using a known substrate detection device.

The invention claimed is:

1. An electrode sheet having a layered structure in which a first insulating layer, a first electrode layer, an inter-electrode insulating layer, a second electrode layer, and a second insulating layer are stacked and attracting a substrate on the first insulating layer, the first electrode layer having a plurality of openings in a specific planar area, and the second electrode layer having opening equivalent portions provided at positions at which the openings in the first electrode layer are projected onto the second electrode layer in a depth direction of the electrode sheet and having almost the same area as the projected openings, and connection portions that connect the opening equivalent portions.

2. The electrode sheet according to claim 1, wherein the first electrode layer has the openings disposed in a grid pattern, and the second electrode layer is formed in a grid pattern using the opening equivalent portions and the connection portions.

3. The electrode sheet according to claim 1, wherein, when a shortest distance between the adjacent openings in the first electrode layer is referred to as X, and the length of a line segment defined by the feet of perpendiculars when projecting the centers of gravity of the adjacent openings onto an imaginary straight line parallel to a straight line along which the adjacent openings are provided at the shortest distance X is referred to as L, the first electrode layer satisfies L/X≧1.5 and L≦2.5 mm.

4. The electrode sheet according to claim 1, wherein the openings in the first electrode layer are circular holes, and the second electrode layer has circular opening equivalent portions.

5. The electrode sheet according to claim 1, wherein a capacitance C1 between the first electrode layer and the second electrode layer when the electrode sheet attracts the substrate and a capacitance C2 between the first electrode layer and the second electrode layer when the electrode sheet does not attract the substrate satisfy (C1-C2)/C1≧0.03.

6. An electrostatic chuck comprising a metal base and the electrode sheet according to claim 1 that is bonded to the metal base.

7. The electrostatic chuck according to claim 6, wherein the electrode sheet is bonded to the metal base through a flexible silicone rubber layer having a thickness of 500 to 1000 μm.

* * * * *